(12) United States Patent
Paul et al.

(10) Patent No.: US 6,512,713 B2
(45) Date of Patent: Jan. 28, 2003

(54) ELECTRONICS AMPLIFIER CIRCUIT HAVING A SWITCHABLE INPUT TRANSISTOR, MATRIX ARRAY OF MEMORY CELLS AND MATRIX ARRAY OF PHOTODETECTORS

(75) Inventors: Steffen Paul, Baierbrunn (DE); Bernhard Wicht, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/940,088

(22) Filed: Aug. 27, 2001

(65) Prior Publication Data

US 2002/0025617 A1 Feb. 28, 2002

(30) Foreign Application Priority Data

Aug. 25, 2000 (DE) ......................................... 100 41 796

(51) Int. Cl.⁷ ................................................ G11C 7/02
(52) U.S. Cl. ................................. 365/208; 365/189.02
(58) Field of Search .............................. 365/208, 189.02

(56) References Cited

U.S. PATENT DOCUMENTS

| | | | |
|---|---|---|---|
| 4,355,335 A | 10/1982 | Imaide et al. | 358/213 |
| 4,463,383 A | 7/1984 | Soneda et al. | 358/212 |
| 4,916,665 A | 4/1990 | Atsumi et al. | 365/185 |
| 5,444,234 A | 8/1995 | Hennerichi et al. | 250/206.2 |
| 5,748,547 A | * 5/1998 | Shau | 365/22 |
| 5,760,791 A | * 6/1998 | Jung et al. | 345/509 |
| 5,783,949 A | * 7/1998 | Reohr et al. | 326/106 |

OTHER PUBLICATIONS

Seevinck, Evert et al.: "Current–Mode Techniques for High–Speed VLSI Circuits with Application to Current Sense Amplifier for CMOS SRAM's", IEEE Journal of Solid–State Circuits, vol. 26, No. 4, dated Apr. 1991, pp. 525–536.
Shibata, Nobutaro et al.: "Megabit–Class Size Configurable 250–MHz SRAM Macrocells with a Squash Memory Cells Architecture" IEICE Trans. Electron., vol. E82 C, No. 1, dated Jan. 1999, pp. 94–104.
Sasaki Katsuro et al.: "A 7–ns 140–mW 1–Mb CMOS SRAM with Current Sense Amplifier", IEEE Journal of Solid–State Circuits, vol. 27, No. 11, dated Nov. 1992, pp. 1511–1518.
Shibata, Nobutaro :"Current Sense Amplifiers for Low–Voltage Memories", IEICE Trans. Electron., vol. E79–C, No. 8, dated Aug. 1996, pp. 1120–1130.
Masanori Izumikawa et al.: "A Current Direction Sense Technique for Multiport SRAM's", *IEEE Journal of Solid–State Circuits*, vol. 31, No. 4, Apr. 1996.

* cited by examiner

*Primary Examiner*—M. Tran
(74) *Attorney, Agent, or Firm*—Laurence A. Greenberg; Werner H. Stemer; Ralph E. Locher

(57) ABSTRACT

An electronic amplifier circuit according to the principle of current detection is coupled to a memory cell field and has an input transistor for each respective row or column of the matrix array. The input transistor is connected to the respective row or column and can be driven and switched by a control signal of a multiplexer circuit. The amplifier circuit may be constructed as a gate circuit or as a transistor diode circuit. A matrix array of memory cells and a matrix array of photodetectors are also provided.

10 Claims, 2 Drawing Sheets

Prior Art
Fig. 3 A
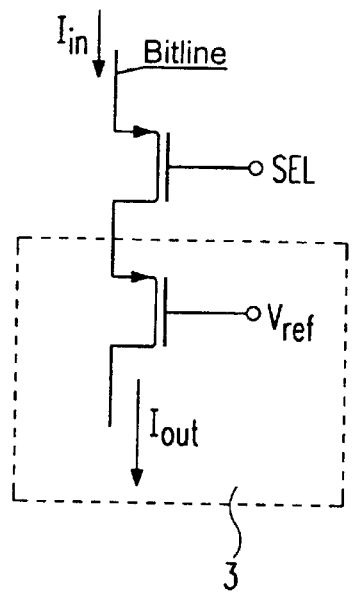
Fig. 3 B
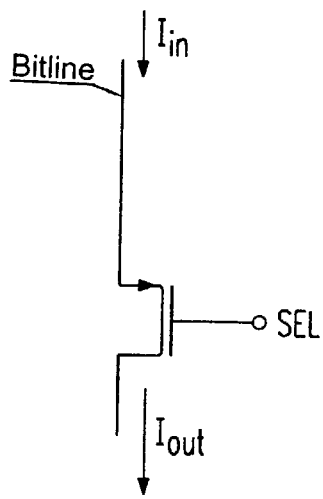
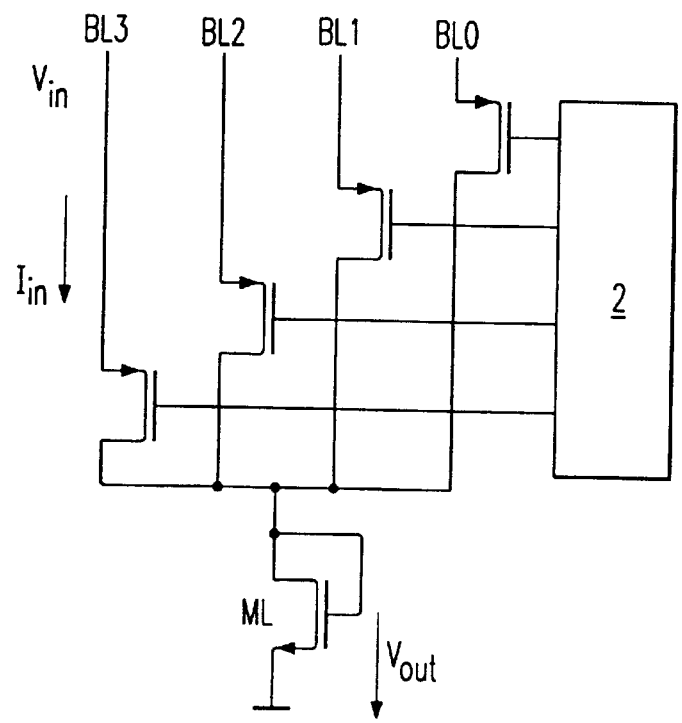
Fig. 3 C

ELECTRONICS AMPLIFIER CIRCUIT HAVING A SWITCHABLE INPUT TRANSISTOR, MATRIX ARRAY OF MEMORY CELLS AND MATRIX ARRAY OF PHOTODETECTORS

BACKGROUND OF THE INVENTION

FIELD OF THE INVENTION

The invention relates to an electronic, current-sensitive amplifier circuit for amplifying electrical current, which is supplied from a row or a column of a matrix array of electronic or optoelectronic components. The matrix array is formed therein in particular by a cell field composed of memory cells, in particular static SRAM memory cells. However it can also be defined by a cell field of photodetectors, in particular photodiodes. The invention also relates to such a matrix array of memory cells, in particular static SRAM memory cells or photodetectors, especially photodiodes. The matrix array is connected to an amplifier circuit according to the invention which itself is coupled to a multiplexer circuit that drives the amplifier circuit.

Electronic amplifier circuits for reading out memory cell fields, which are referred to as current sense amplifiers, according to the principle of current detection have a shorter readout delay in comparison with voltage detection because the current of the memory cell is extracted with low impedance. That has been described in particular in the publications entitled "Current-Mode Techniques For High-Speed VLSI Circuits With Application to Current Sense Amplifier For CMOS SRAMs" by Seevinck et al. in IEEE Journal of Solid-State Circuits, vol. 26, No. 4, pages 525–536 (referred to below as "Seevinck") and "Current Sense Amplifiers For Low-Voltage Memories" by N. Shibata in IEICE Trans. Electron., Vol. E79-C, No. 8, pages 1120–1130 (referred to below as "Shibata I"). The smaller the input resistance of the current sense amplifier, the shorter the time required to read out the memory contents.

The invention relates in particular to memory architectures in which each current sense amplifier is assigned a plurality of columns (bit line pairs), one of which is connected to the current sense amplifier by a multiplexer circuit in each case. Such a configuration is illustrated in FIG. 1 and discussed in greater detail below. However, a MOS transistor which is respectively selected and switched on by a multiplexer circuit has a finite resistance that is located in series with an input resistance of a current sense amplifier and thus has a disadvantageous influence on the timing behavior and the level of the signal current flowing into the current sense amplifier. That has been investigated in a publication entitled "Megabit-Class Size-Configurable 250 MHz SRAM Macrocells With a Squashed Memory Cell Architecture" by N. Shibata et al., in IEICE Trans. Electron., Vol. E82 C, No. 1, pages 94–103 (referred to below as "Shibata II").

In the prior art, such disadvantages are usually accepted, as is shown by a publication entitled "A 7-ns 140 mW 1-Mb CMOS SRAM With Current Sense Amplifier" by K. Sasaki et al. in IEEE Journal of solid-state circuits, Vol. 27, No. 11, pages 1511–1518 (referred to below as "Sasaki").

Alternatively, current sense amplifiers with the classic principle of voltage detection are used to read out static memory cells ("Seevinck", FIG. 10). In that case, the bit line voltage is tapped with high impedance. Since there is virtually no current flowing across the multiplexer transistor, its resistance is uncritical with respect to the timing period. However, in principle the voltage detection is slower than the current detection because the high bit line capacitance has to be recharged.

As a further alternative solution to the above-mentioned problems, current sense amplifiers with such a small surface that they can be assigned precisely to one bit line pair ("Seevinck") are used. The multiplexer disposed at the point which is critical for the readout time, between the bit line and the current sense amplifier, is thus dispensed with.

However, the increased number of current sense amplifiers leads to an increased space requirement.

SUMMARY OF THE INVENTION

It is accordingly an object of the invention to provide an electronic amplifier circuit having a switchable input transistor, a matrix array of memory cells and a matrix array of photodetectors, which overcome the hereinafore-mentioned disadvantages of the heretofore-known devices of this general type and in which the electronic amplifier circuit is current-sensitive and has improved properties, in particular improved timing behavior for amplifying current from a matrix array of electronic or optoelectronic components.

With the foregoing and other objects in view there is provided, in accordance with the invention, in a memory configuration having a matrix array of electronic or optoelectronic components in rows or columns, and a multiplexer circuit supplying a control signal, an electronic, current-sensitive amplifier circuit for amplifying electrical current from the rows or columns. The amplifier circuit comprising input transistors to be driven and switched by the control signal. The input transistors are each connected to a respective one of the rows or columns.

The input transistor of the interface circuit is thus used simultaneously as a switching transistor of the multiplexer circuit. Instead of a fixed voltage, the gate terminal of the input transistor is driven by the multiplexer signal. In that way, the transistor can be switched on and off and itself becomes functionally part of the multiplexer circuit. In the switched-on state (gate terminal connected to the operating voltage or to ground depending on the type of transistor), the transistor acts as an amplifier according to the principle of the gate circuit (cascode) and produces the required low input resistance. Current sense amplifiers according to that principle implement the simplest form of current detection, but have a relatively high input resistance in comparison with more complex circuits ("Shibata I", Table 1). However, the proposed combination with the multiplexer function provides an advantage in terms of area over other solutions. The solution according to the invention is thus highly suitable for products with severe restrictions in terms of spatial requirements and average requirements in readout speed. Since no additional amplifiers are required, the power consumption is also not very high. The circuits according to the invention are also highly reliable due to their simplicity.

The invention is suitable in particular for a memory cell array, especially a cell field, made of static SRAM memory cells. However, the amplifier circuit according to the invention can also be coupled to a matrix of photodetectors, in particular photodiodes, having pixels which can also be connected through a multiplexer to a current sense amplifier. The advantages of the amplifier circuit according to the invention are also applicable in this case.

Other features which are considered as characteristic for the invention are set forth in the appended claims.

The invention is illustrated and described herein as embodied in an electronic amplifier circuit having a switchable input transistor, a matrix array of memory cells and a matrix array of photodetectors.

The invention is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 3A, 3B and 3C are schematic and block diagrams respectively illustrating a conventional configuration, the principle according to the invention and an exemplary embodiment of an amplifier circuit according to the invention.

DESCRIPTION OF THE PREFERRED EMBODIMENTS

Figure 1:
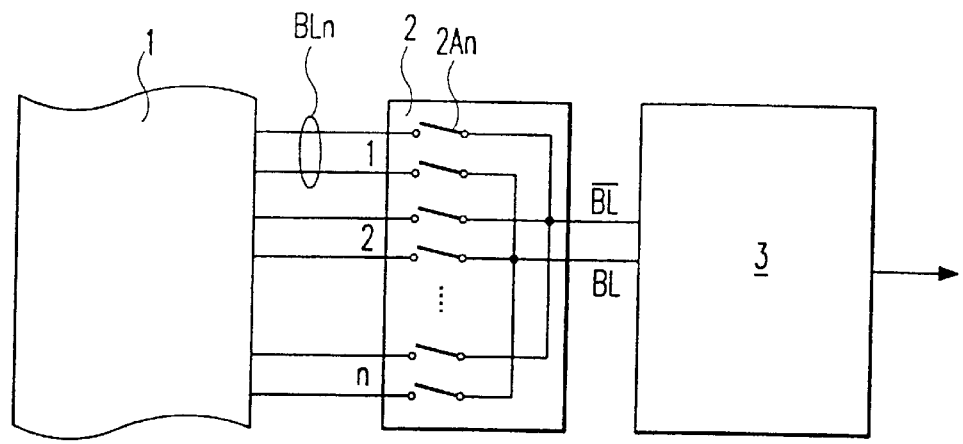
FIG. 1 is a schematic and block diagram of a conventional circuit composed of a SRAM memory cell field, a multiplexer circuit and a current sense amplifier.

Referring now to the figures of the drawings in detail and first, particularly, to FIG. 1 thereof, there is seen a memory architecture configuration in which each current sense amplifier 3 is assigned a plurality of columns (bit line pairs), each respective one of which is connected to the current sense amplifier 3 by a multiplexer circuit 2. A SRAM memory cell field 1 has memory cells with a memory content to be read out in that configuration. The memory cells in the memory cell field 1 are disposed in rows in the form of a matrix along n bit lines. The memory cell field 1 has n bit line pairs BLn, which are connected to the multiplexer circuit 2 through corresponding outputs of the memory cell field 1. The multiplexer circuit 2 has essentially a two-pole output and n switches, in particular MOS transistors 2A$n$ having a function which is to connect one of the bit line pairs BLn to the output by predefinition of the multiplexer circuit 2. An output of the multiplexer circuit 2 is coupled to the current sense amplifier 3, through the use of which a current signal supplied by the corresponding bit line pair is amplified and fed at its output to an information output device.

However, the MOS transistor 2A$n$ which is respectively selected and switched on by the multiplexer circuit 2 has a finite resistance that is located in series with the input resistance of the current sense amplifier 3 and thus has a disadvantageous influence on the timing behavior and the level of the signal current flowing into the current sense amplifier 3.

Simple circuit variants, which are known per se in the prior art, for a current sense amplifier-according to the principle of current detection, are illustrated in FIGS. 2A–2D. The transistors are represented as MOS transistors in the circuit diagrams. However, this does not constitute a basic restriction, since the use of bipolar transistors is also conceivable instead of MOS transistors.

Figure 2:
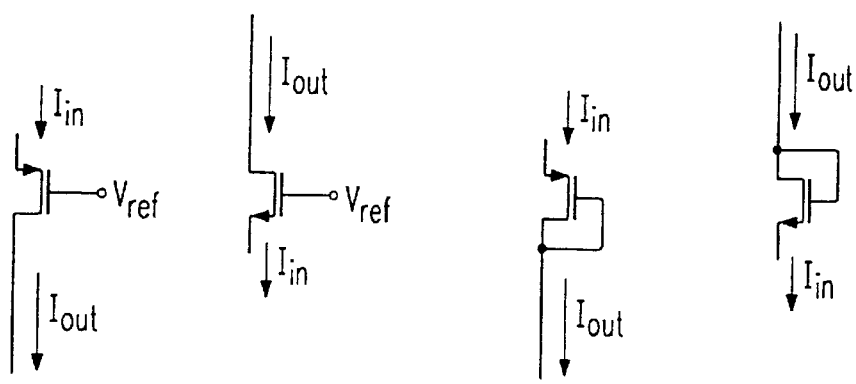
FIGS. 2A–2D are schematic circuit diagrams showing simple basic circuits of current sense amplifiers for current detection.

Current-sensitive current sense amplifiers which are constructed on the basis of the gate circuit are illustrated in FIGS. 2A and 2B. FIG. 2A shows a gate circuit with a p-type channel transistor, and FIG. 2B shows a gate circuit with an n-type channel transistor. In FIGS. 2C and 2D, a transistor is functionally converted into a transistor diode by connecting the gate to the source or drain. In FIG. 2D, an n-type channel transistor is illustrated, while in FIG. 2C a p-type channel transistor is shown.

A gate circuit is also illustrated in FIG. 3 of the publication "Shibata I" mentioned above. The current to be measured from the memory cell field flows through the transistor of the gate circuit to a load resistor, across which a voltage drops, that is a measure of the current to be measured. The gate circuit illustrated in FIG. 3 of that publication and the associated descriptive text is incorporated by reference into the disclosure of the present application.

A conventional current sense amplifier/multiplexer combination is once more shown in a simplified view in FIG. 3A of the present application. In that combination, a constant voltage $V_{ref}$ is applied to the gate terminal of the input transistor of the current sense amplifier 3. In order to select a specific bit line, the transistor associated with this bit line is driven by a multiplexer signal SEL. In contrast, in the configuration according to the invention illustrated FIG. 3B, a single transistor is used which acts simultaneously as the input transistor of the current sense amplifier and the switching transistor of the multiplexer. The gate terminal of this single transistor is driven by the multiplexer signal SEL, as a result of which the transistor can be switched on and off. In the switched-on state, the gate terminal is aconnected to the operating voltage or to ground depending on to the type of transistor. In this state, the transistor acts as an amplifier according to the gate circuit principle, and produces the required low input resistance.

An exemplary embodiment of the amplifier circuit according to the invention is illustrated in FIG. 3C. This circuit is coupled to a number of bit lines BL0, BL1, BL2 and BL3, which are connected to corresponding outputs of a memory cell field. In order to select one of the bit lines BL0 to BL3, the corresponding transistor is switched on, for example, by connecting its gate terminal to ground with a multiplexer circuit 2. While a current $I_{in}$ supplied by the memory cell flows to a load transistor ML, only a low voltage range is produced at the respective bit line. A voltage $V_{out}$ corresponding to the input current can be tapped at the load transistor ML for further processing. All of the input transistors are thus connected at the output end to one another and to the load transistor ML. The load transistor ML is constructed as a transistor diode by connecting its gate terminal to its drain.

Alternatively to this, the gate circuit in FIG. 3 of the publication "Shibata I" can be used in an analogous way by connecting the input transistors at the output end to one another and to a load resistor at which a voltage drop is tapped as a measure of the current to be measured.

We claim:

1. In a memory configuration having a matrix array of electronic or optoelectronic components in rows or columns, and a multiplexer circuit supplying a control signal, an electronic, current-sensitive amplifier circuit for amplifying electrical current from the rows or columns, the amplifier circuit comprising:

input transistors to be driven and switched by the control signal, said input transistors each connected to a respective one of the rows or columns; and a load transistor having a source, a drain and a gate connected to one of the source and drain;

said input transistors having output ends connected to one another and to said load transistor.

2. In a memory configuration having a matrix array of electronic or optoelectronic components in rows or columns, and a multiplexer circuit supplying a control signal, an electronic, current-sensitive amplifier circuit for amplifying electrical current from the rows or columns, the amplifier circuit comprising:

input transistors to be driven and switched by the control signal, said input transistors each connected to a respective one of the rows or columns; and a load transistor having an emitter, a collector and a base connected to one of the emitter and collector;

said input transistors having output ends connected to one another and to said load transistor.

3. The amplifier circuit according to claim 2, wherein the matrix array is a cell field of memory cells.

4. The amplifier circuit according to claim 2, wherein the matrix array is a cell field of static SRAM memory cells.

5. The amplifier circuit according to claim 1, wherein the matrix array is a cell field of memory cells.

6. The amplifier circuit according to claim 1, wherein the matrix array is a cell field of static SRAM memory cells.

7. In a memory configuration having a cell field of photodetectors in rows or columns, and a multiplexer circuit supplying a control signal, an electronic, current-sensitive amplifier circuit for amplifying electrical current from the rows or columns, the amplifier circuit comprising:

input transistors to be driven and switched by the control signal, said input transistors each connected to a respective one of the rows or columns.

8. In a memory configuration having a cell field of photodiodes in rows or columns, and a multiplexer circuit supplying a control signal, an electronic, current-sensitive amplifier circuit for amplifying electrical current from the rows or columns, the amplifier circuit comprising:

input transistors to be driven and switched by the control signal, said input transistors each connected to a respective one ay the rows or columns.

9. In a memory configuration having an amplifier circuit with input transistors, and a multiplexer circuit coupled to the amplifier circuit for driving and switching on the input transistors, a matrix array, comprising:

photodetectors connected to the amplifier circuit.

10. In a memory configuration having an amplifier circuit with input transistors, and a multiplexer circuit coupled to the amplifier circuit for driving and switching-on the input transistors, a matrix array, comprising:

photodiodes connected to the amplifier circuit.

* * * * *